United States Patent [19]
Claus et al.

[11] 4,228,477
[45] Oct. 14, 1980

[54] CIRCUIT FOR MONITORING THE CURRENT DISTRIBUTION IN PARALLEL-CONNECTED CONVERTED BRANCHES

[75] Inventors: Achim Claus; Heinrick Geissing; Willi Ulbrich, all of Erlangen, Fed. Rep. of Germany

[73] Assignee: Siemens Aktiengesellschaft, Berlin & Munich, Fed. Rep. of Germany

[21] Appl. No.: 8,040

[22] Filed: Jan. 31, 1979

[30] Foreign Application Priority Data

Feb. 20, 1978 [DE] Fed. Rep. of Germany ....... 2807095

[51] Int. Cl.² ............................................. H02H 3/28
[52] U.S. Cl. ................................... 361/87; 340/645; 363/54; 363/69
[58] Field of Search ................. 361/87; 363/52–57, 363/68–70; 340/645

[56] References Cited
U.S. PATENT DOCUMENTS 3,205,423 9/1965 Kanngiesser ................. 361/87 X
3,806,906 4/1974 Young ........................... 363/54 X

FOREIGN PATENT DOCUMENTS 1121206 1/1962 Fed. Rep. of Germany ............ 363/68

Primary Examiner—Harry E. Moose, Jr.
Attorney, Agent, or Firm—Kenyon & Kenyon

[57] ABSTRACT

A circuit arrangement for monitoring the current inbalance in two parallel-connected converter branches, each of which includes at least two series-connected converter valves. The anodes and cathodes, respectively, of adjacent converter valves in a given branch are connected together via cross-connections containing current transformers. A differential current transformer is provided at the output junction point of the two converter branches. Starting with the output signal of the differential current transformer, the exact current misdistribution for each adjacent converter valve pair is determined via summing amplifiers by adding the currents of the transverse transformers. A protective measure is triggered if a current misdistribution occurs.

10 Claims, 2 Drawing Figures

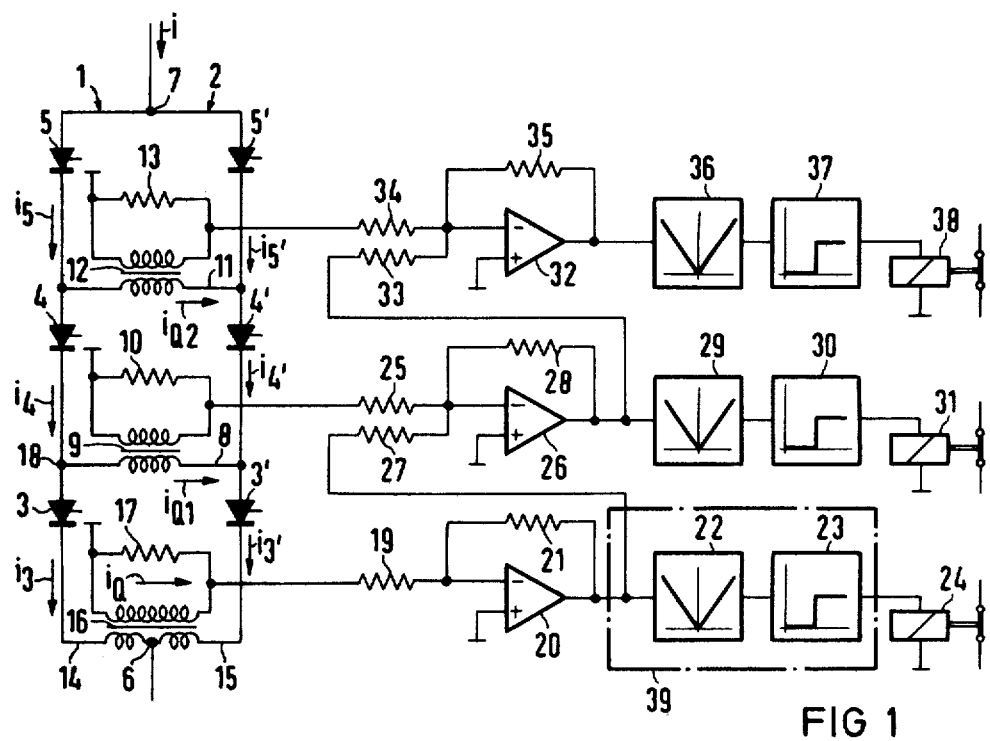
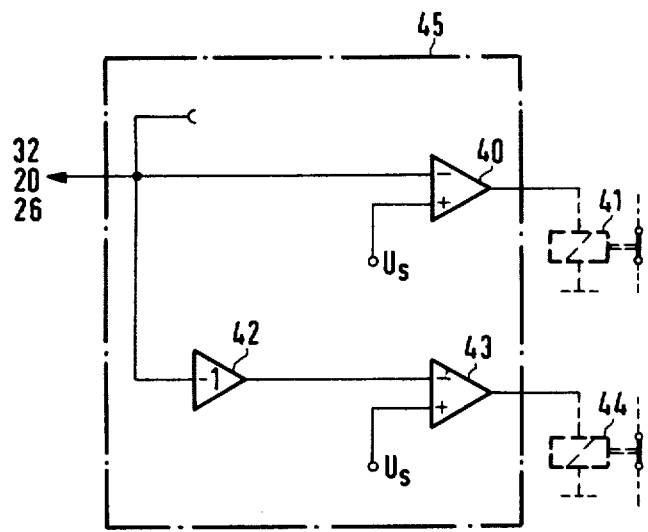

CIRCUIT FOR MONITORING THE CURRENT DISTRIBUTION IN PARALLEL-CONNECTED CONVERTED BRANCHES

BACKGROUND OF THE INVENTION (a) Field of the Invention

This invention relates to a circuit arrangement for monitoring the faulty current distribution (current imbalance) in two converter branches, connected in parallel, each of which contains at least two series-connected converter valves. More particularly, a differential current transformer measures the difference between the currents flowing at the junction point of the two converter branches; the anodes and cathodes, respectively, of adjacent converter valves in both converter branches are connected to each other by cross-connections each of which contain the primary winding of a current transformer; and threshold detectors are associated with each current transformer for initiating protective measures.

(b) Description of the Prior Art

In converter installations of high power rating which serve, for instance, as part of a high voltage DC transmission system, converter valves connected in parallel are used because the current carrying capacity of individual available converter valves is limited. Such arrangements are built up from several series-connected converter valves in order to overcome the limited reverse voltage rating of a single converter valve. To avoid overloading individual converter branches, the current in the converter branches must be monitored so that uniform division occurs.

German Auslegeschrift 25 21 262, at FIG. 4 shows a circuit arrangement of the type just mentioned in which the anodes and cathodes, respectively, of adjacent converter valves in the parallel converter branches are connected to each other via cross connections each containing the primary winding of a current transformer. A differential current transformer is also provided at a junction point of the two converter branches which measures the difference of the currents flowing into the junction point in the two converter branches. The output voltage of the differential current transformer and the current transformers taken off at a load is fed to a respective threshold detector which responds and activates a refiring device, addressing firing pulses to the control path of the valve carrying the smaller partial current. If, therefore, the transverse current in a cross-connection exceeds a predetermined amount, a converter valve is refired. A considerable transverse current can occur when one of the valves of the converter branches does not become conducting upon a first firing pulse.

In such a circuit arrangement, the current in the individual converter valves is not determined exactly; conclusions are merely drawn from an increase in the transverse current that a converter valve lacks conductivity. In a parallel circuit having a multiplicity of series connected converter branches, however, rectified currents can flow in the cross connections whose magnitude remains below the response threshold of the threshold element and which add up, toward the end of the converter branch, to a toal current leading to an overload and possible destruction of the converter valves near the end. The trouble just described cannot be detected by the circuit of German Auglegeschrift 25 21 262.

To provide for this kind of trouble, it would seem necessary to measure the current flowing in each converter valve by means of a separate current transformer. This, however, necessitates a large expenditure for current transformers and results in an increase of the resistance of the converter branches from insertion of the current transformers in the series branches. Inserting current transformers into the series branches also involves considerable costs because the electrical connections between the individual branch converter valves, which may already be prefabricated, must be opened up.

It is an object of the invention to detect the faulty current distribution in adjacent converter valves of parallel connected converter branches without the need to assign a separate current transformer to each converter valve in the series branch.

Faulty current distribution is herein understood to mean the departure of the level of current flowing in a converter valve from one half the value of the total current flowing at the junction point of the two converter branches.

SUMMARY OF THE INVENTION

The problem outlined above is solved, in accordance with the present invention, by providing for the output voltage of the differential current transformer to be fed to an amplifier whose output signal is fed via an absolute value former to a threshold detector (element). A number of summing amplifiers corresponding to the number of cross-connections is provided whose output signals are fed via absolute value formers to other threshold detectors. The summing amplifiers are connected so that the output voltage of the associated current transformer is present at the adding input of one amplifier and the output signal of the respective preceding summing amplifier or amplifiers is present at the other adding input of the amplifier. The ratio of the gains of the amplifier and the summing amplifiers is 0.5 to 1.

If the gains of the amplifier and the summing amplifiers are equal and the ratio of the load resistances of the differential current transformer and the current transformers is 0.5 to 1, the same effect is obtained.

By using threshold detectors having variable threshold levels (values), the selection of a trigger threshold for taking protective action in response to the magnitude of the critical current distribution can be accomplished at low cost. The output signals of the summing amplifiers and the amplifier can also be used for measuring purposes, making it possible to monitor the individual current distributions continuously.

The present invention is based on the discovery that, starting from the output voltage of the differential current transformer which corresponds to twice the current misdistribution in the parallel converter valves nearest to the differential current transformer, the faulty current distribution in the corresponding parallel-connected converter valves of both converter branches associated with this current transformer is determined by addition, with the correct sign, of the output of the current transformer nearest the differential current transformer. Thus, the faulty current distribution of the nearest parallel-connected converter valve pair can be detected from the faulty current distribution of the preceding parallel-connected converter valve pair as determined by adding the output voltage of the next following current transformer. It is thus possible to determine the current misdistribution exactly and at low cost, using a relatively small number of current transformers which can be inserted without opening up the series connections between the individual converter valves of the converter branches. The addition of signals resulting from faulty current distribution in a preceding converter valve pair to the nearest transverse current is accomplished by a summing amplifier for each leg. The output signal of the summing amplifier contributes to the determination of current distribution in the following parallel-connected converter valve pair, and also is fed to a threshold detector, for detecting an excessive, valve-endangering current misdistribution and initiating a protective measure. Such a protective measure is ordinarily aimed at interrupting the current flow in the converter branches and signalling existence of a dangerous condition.

Installation can be simplified and cheapened by employing bushing transformers for the differential current transformer and the current transformers. For the same reason, it is advantageous to bring the conductor sections located immediately ahead of the junction point through the measuring openings of the differential current transformer in opposite senses of direction.

In a preferred embodiment, operational amplifiers are used as the amplifier and the summing amplifiers; they are available as inexpensive, space saving, and cost-effective components.

Also, instead of using separate absolute value formers, the output signal of each amplifier and the summing amplifier can be fed to a first threshold detector instead of each absolute value former, and thence, via an inverting element, to a second threshold detector. Such an inverting element can be made by external circuit connection of an operational amplifier, as is well known. The threshold detectors can be operational amplifiers, in which a DC voltage, applies to the non-inverting input, establishes as the threshold value. When the same threshold level is applied to all amplifiers, each threshold element responds at the same level of the faulty current distribution.

When a threshold detector responds, the protective measure triggered may consist of both converter branches being disconnected by a switch. Then, instead of the disconnected converter branch pair, a redundantly provided pair of converter branches starts to operate. In a self-commutating converter, the controlled converter valves of the converter branch pair can be switched off when a threshold detector responds. A quenching device is already provided in such converters.

In a parallel circuit of more than two converter branches each of which contains at least two series-connected converter valves, the faulty current distribution for all corresponding converter valves of the converter branches can be detected by determining the transverse currents (with the proper sign) and the faulty current distribution in the converter branches immediately ahead of the junction point and by adding, with the proper sign, the transverse currents to the signals corresponding to the faulty current distribution in the preceding mutually corresponding converter valves of the converter branches involved.

DETAILED DESCRIPTION OF THE DRAWINGS

FIG. 1 shows a circuit arrangement in accordance with the teachings of the invention for monitoring the faulty current distribution in two parallel-connected converter branches, each of which contains three series-connected converter valves, and FIG. 2, an alternative embodiment of a circuit for taking absolute values and using two threshold detectors.

DETAILED DESCRIPTION OF THE INVENTION

In the left hand part of FIG. 1, two parallel-connected converter branches 1 and 2 are shown. Converter branch 1 consists of the three series-connected thyristors 3, 4, and 5 employed as converter valves. Converter branch 2 consists of the three series-connected thyristors 3', 4', and 5'. Converter branches 1 and 2 are joined together at the junction points 6 and 7 to form a parallel circuit. The anodes of the adjacent converter valves 3 and 3' and the cathodes of the adjacent converter valves 4 and 4' are connected together by a cross-connection 8 containing the primary winding of a current transformer 9. The secondary winding of the current transformer 9 is connected to a load resistor 10 across which an output voltage proportional to the transverse current $i_{Q1}$ is taken off. The anodes of adjacent converter valves 4 and 4' and the cathodes of adjacent converter valves 5 and 5' are similarly connected together by cross-connection 11 which contains the primary winding of current transformer 12. The secondary winding of current transformer 12 feeds a load resistor 13 which furnishes an output voltage proportional to transverse current $i_{Q2}$ flowing in cross connection 11. For determining the faulty current distribution of the current flowing through adjacent thyristors 3 and 3', differential current transformer 16 is arranged in the corresponding line sections 14 and 15 on the current side. An output voltage proportional to the current difference in thyristors 3 and 3' appears across load resistor 17 connected to the secondary of transformer 16.

How the current distribution in all adjacent thyristor pairs can be determined from the transverse currents will be shown in the following. Where i, is the total current dividing at the junction point 7 into the two converter branches 1 and 2, i/2, the current through one thyristor with ideal division, $i_n, i_{n'}$, the current in the thyristors n, n', $i_F$, the faulty division in a thyristor pair $$n, n', = i_n - i/2,$$

it follows from the circuit that:

$$i_3 + i_3' = i, \text{ and}$$

$$i_3 - i_3' = i_Q.$$

The difference measured by the differential current transformer 16 between the currents $i_3$ and $i_3'$ flowing through the thyristors 3 and 3', respectively, is designated $i_Q$. Then the faulty current distribution $i_{F3}$ in the thyristors 3 and 3':

$$i_{F3} = i_3 - i/2 = i_Q/2.$$

Thus, the faulty current distrubition $i_{F3}$ between the thyristors 3 and 3' is equal to one-half the current difference determined by the differential current transformer 16.

Starting from there, the faulty current distribution in the next thyristor pair 4, 4' is calculated. By using the nodal point rule, one obtains for the currents in the nodal point 18:

$$i_4 = i_{Q1} + i_3 = i_{Q1} + i/2 + i_Q/2.$$

From this, one obtains for the faulty current distrbution $i_{F4}$ in the thyristor 4 and 4':

$$i_{F4} = i_4 - i/2 = i_{Q1} + i_{Q2} = i_{Q1} + i_{F3}.$$

Similarly, one obtains for the faulty current distribution $i_{F5}$ in the thyristor pair 5 and 5':

$$i_{F5} = i_{Q2} + i_{F4}.$$

As a general relation one therefore obtains the faulty current distribution of a thyristor pair as the sum of the transverse current between the thyristor pair under consideration and the faulty current distribution of the preceding thyristor pair.

The output voltages furnished by the current transformers 9 and 12 and the differential current transformer 16 are proportional to the transverse currents and the current difference, respectively; they are processed further in the part of the circuit arrangement shown on the right of FIG. 1 as described below. It is essential that the currents in the current transformers and the differential current transformer be picked up and processed with the correct sign. Also bushing transformers can serve as current transformers 9 and 12 and the differential current transformer 16, having the advantage that they are particularly easy to install. When differential current transformer 16 is a bushing transformer, the line sections 14 and 15 located immediately ahead of junction point 6 must be brought through the measuring openings of that transformer in opposite directions.

The output voltage of differential current transformer 16 is fed via series resistor 19 to amplifier 20 which, in the illustrative embodiment is an operational amplifier having a feedback resistor 21. The resistors 19 and 21 are so proportioned that a gain of 0.5 is obtained. Thus, a signal proportional to the current misdistribution in the thyristor pair 3, 3' is present at the output of the amplifier. This signal is fed to absolute value former 22, which provides an output voltage proportional to the input voltage, regardless of the sign of the input voltage. The signal from absolute value former 22 is fed to threshold detector 23 where, if the input voltage exceeds a predetermined threshold level, an output signal is delivered to relay 24. When the threshold level is exceeded, relay 24 operates, since thyristor branches 1 and 2 have been determined to be endangered by a considerable current misdistribution in the thyristor pair 3, 3'; the branches are thereby shut off, or the entire converter circuit is shut down.

To ascertain and monitor the faulty current distribution $i_{F4}$ in the next thyristor pair 4, 4', the signal corresponding to the transverse current $i_{Q1}$ is fed, together with the output signal of amplifier 20, to the adding input of summing amplifier 26. Summing amplifier 26 is an opertional amplifier having an external circuit and is of a kind well known in the art. The voltages to be added are fed via 25 and 27 to the inverting input of the operational amplifier and the amplifier is bridged by feedback resistor 28. The summing amplifier 26 adds the fault current distribution signal from the preceding thyristor pair 3, 3' to the transverse current $i_{Q1}$ signal which corresponds to the faulty current distribution in the thyristor pair 4, 4', as was explained above. The ouput signal of summing amplifier 26 is fed via absolute-value former 29 to the threshold member 20, which, when it responds, signals an extreme current misdistribution in the thyristor pair 4, 4' and causes relay 31, connected thereto, to initiate protection of the endangered converter branches.

Ascertaining and monitoring the faulty current distribution in the thyristor pair 5, 5' is accomplished analogously by adding the determined current misdistribution $i_{F4}$ for the thyristor pair 4,4° to the transverse current $i_{Q2}$ in current transformer 12 by means of summing amplifier 32 with its external circuit resistors 33, 34 and 35. Here, too, the output signal of summing amplifier 32 is fed, as already explained above, to a threshold member 37, through which a relay 38 for effecting a protective measure may be activated.

It has been assumed so far that amplifier 20 has a gain of 0.5 and that summing amplifiers 26 and 32 each have a gain of 1. However, amplifier 20 and summing amplifiers 26 and 32 can also have higher or lower gains. It is important only that the gain provided by the fault detecting circuit including amplifier 20 be half that of the circuits which includes summing amplifiers 26 and 32. Thus, if amplifiers having the same gain are used for amplifier 20 and summing amplifiers 26 and 32, then resistors 27 and 25 must have a resistance ratio of 0.5 to 1 to take into consideration the fact that the current difference measured by the differential current transformer 16 is double the faulty current distribution in thyristors 3 and 3'. In that case the threshold level of the threshold detector 23 must also be double that of the other threshold members. When amplifier 20 and summing amplifiers 26 and 32 have the same gain, load resistances 17, 10, and 13 can, in the alternative, be designed with a resistance ratio of 0.5 to 1, so as to generate an exact image of the faulty current distribution at the outputs of amplifier 20 and summing amplifiers 26 and 32.

Protective measures triggered by the activation of relays 24, 31 and 38 can be, besides switching off the endangered converter branches or shutting down the entire converter circuit, the quenching of endangered converter branches, in the case of self-commutating converters, by means of the quenching device which is already included in such devices.

The series circuit consisting of absolute-value former 22 and threshold member 23, shown in the dash-dotted rectangle 39, can be replaced by a circuit arrangement as shown in FIG. 2. The output voltage of amplifier 20 (or 26 or 32) is applied directly to the inverting input of an operational amplifier 40 which serves as the threshold detector. A DC voltage $U_s$ is applied to the non-inverting input of operational amplifier 40 which fixes the level of the threshold value. If the threshold value level is exceeded, relay 41 is activated to trigger a protective measure. Since the difference current $i_Q$ determined by differential current transformer 16 and transverse currents $i_{Q1}$ and $i_{Q2}$, measured by the current transformers can flow in different directions and since this is correctly ascertained with the correct sign by differential current transformer 16 and current transformers 9 and 12, the output signals of summing amplifiers 20, 26 and 32 can have different polarities. Since the operational amplifier 40 employed as the threshold detector is suited only for ascertaining the threshold value of an output signal of a given polarity, the output signal of the amplifier 20 is also fed to the inverting input of operational amplifier 43, serving as the threshold member, via an inverter 42. The voltage $U_s$, which determines the response of the threshold member, is also applied to the non-inverting input of operational amplifier 43. Then, if operational amplifier 43, which serves as the threshold member, responds, it triggers, via relay 44, one of the protective measures described above. The circuit arrangement contained in "frame" 45 of FIG. 2 can be used instead of each series circuit consisting, respectively, of absolute-value formers 22, 29, and 36 and threshold members 23, 30, and 37 of FIG. 1. Then, in each case, the operational amplifier 40 serves as the threshold detector for the output signal from amplifier 20 and summing amplifiers 26 and 32 of one polarity; and operational amplifier 43 serves as the threshold detector of the output signal having the other polarity.

In summary, it can be stated that the circuit arrangement taught in accordance with the invention provides exact monitoring of current misdistribution in every adjacent, parallel-connected thyristor pair in each of the parallel-connected converter branches. This result is achieved with relatively small expenditure for current transformers.

What is claimed is:

1. A circuit arrangement for monitoring current in two parallel-connected converter branches each of which comprises at least two series-connected converter valves comprising:

a differential current transformer for measuring the difference between the levels of currents flowing in the two branches at a junction point of the branches, cross-connections, each containing the primary winding of a current transformer, for connecting the anodes and cathodes of corresponding converter valves in both branches, and threshold detection means associated with each transformer for triggering protective measures in response to current imbalance comprising an amplifier connected to the output of the differential current transformer for supplying a signal to a threshold detector and a summing amplifier in each cross-connection for supplying a signal to a threshold detector, the summing amplifier having one summing input connected to the current transformer and another summing input connected to the output of the respective preceding amplifier, the gains of the circuits containing the amplifier and the summing amplifiers being in the ratio of 0.5 to 1, respectively.

2. A circuit arrangement in accordance with claim 1 in which the differential current transformer and the current transformers comprise bushing current transformers.

3. A circuit arrangement in accordance with claim 2 in which the line sections located immediately ahead of the junction point of both converter branches are brought through the measuring openings of the differential current transformer in opposite directions.

4. A circuit arrangement in accordance with claim 1 in which the amplifier and the summing amplifiers comprise operational amplifiers.

5. A circuit arrangement in accordance with claim 1 in which each threshold detection means includes an absolute value former connected between the amplifier and the threshold detection.

6. A circuit arrangement in accordance with claim 1 in which the output signal of the amplifier or one of the summing amplifiers is fed to a first threshold detector and, via an inverter, to a second threshold detector.

7. A circuit arrangement in accordance with claim 1, further comprising the threshold members being operational amplifiers having a uniform DC voltage applied to the noninverting inputs of the amplifiers as the threshold value.

8. A circuit arrangement in accordance with claim 1 in which the protective measure triggered by a threshold detector is disconnection of both converter branches by a switch.

9. A circuit arrangement in accordance with claim 1 wherein the converter is self-commutating and the protective measure comprises the controlled converter valves of both converter branches being quenched when a threshold detector responds.

10. A circuit arrangement in accordance with any one of claims 1 to 9, further comprising the protective measure being triggered by relays connected to the threshold detectors.

* * * * *